United States Patent [19]

McClenahan

[11] 4,438,395

[45] Mar. 20, 1984

[54] CURRENT TRANSFORMER HIGH VOLTAGE PROBE UTILIZING COPPER SULFATE WATER RESISTOR

[75] Inventor: Charles R. McClenahan, Albuquerque, N. Mex.

[73] Assignee: The United States of America as represented by the Secretary of the Air Force, Washington, D.C.

[21] Appl. No.: 265,865

[22] Filed: May 21, 1981

[51] Int. Cl.³ .................... G01R 15/02; H01C 11/00
[52] U.S. Cl. ............................... 324/127; 324/128; 338/222
[58] Field of Search .............. 324/127, 128; 338/222

[56] References Cited

U.S. PATENT DOCUMENTS

| | | | |
|---|---|---|---|
| 3,028,539 | 4/1962 | Wright | 324/127 |
| 3,467,864 | 9/1969 | Vander Plaats | 324/102 |
| 3,539,470 | 11/1970 | Icre | 252/500 |
| 3,845,448 | 10/1974 | Hadermann | 338/222 |
| 4,112,409 | 9/1978 | Jacquelin | 338/222 |
| 4,140,961 | 2/1979 | Akamatsu | 323/6 |
| 4,163,130 | 7/1979 | Kutoba et al. | 200/144 |

*Primary Examiner*—Ernest F. Karlsen
*Attorney, Agent, or Firm*—Donald J. Singer; Willard R. Matthews

[57] ABSTRACT

A current transformer and copper sulfate water resistor are combined to provide a probe capable of measuring very fast, high voltage pulses. The resistor is connected in series with the primary winding of the current transformer and consists of an elongated plastic tube filled with an aqueous solution of copper sulfate. The series arrangement of resistor and current transformer primary winding is applied across the source of voltage to be measured and the current transformer secondary winding output is a function of the measured voltage. The current transformer secondary output is applied to and displayed on an oscilloscope.

2 Claims, 2 Drawing Figures

CURRENT TRANSFORMER HIGH VOLTAGE PROBE UTILIZING COPPER SULFATE WATER RESISTOR

STATEMENT OF GOVERNMENT INTEREST

The invention described herein may be manufactured and used by or for the Government for governmental purposes without the payment of any royalty thereon.

BACKGROUND OF THE INVENTION

This invention relates to voltage measuring devices and in particular to a high voltage probe capable of measuring short duration high voltage pulses in an environment where high levels of electromagnetic noise are present.

Devices of this type find particular utility in applications where it is necessary to measure very fast high voltage pulses in a very noisy environment where a common reference potential (ground) is not clearly defined. One example of this type of application is a probe that measures high voltage transients developed when a metallic foil fuses while carrying very large currents.

State-of-the-art methods and devices for measuring the voltage across a fuse in this type of application have generally proved to be less than satisfactory. Many different techniques have been tried. These techniques included resistive dividers, capacitive dividers and capacitive V-dot probes. None of these proved to be wholly satisfactory. All of the foregoing approaches attempted to measure a known fraction of the fuse voltage directly. However, the fuse commonly is separated from the nominal ground by significant inductances (~20 nH). Moreover, rather large dI/dt's ($\gtrsim 1$ ma/us) are produced during the course of experiments that measure the voltage at the time the foil is fused. Consequently, a large amount of electrical noise is produced which swamps the signals from the probe.

The several limitations of prior art type voltage measuring devices can be overcome by a new alternative approach that comprehends measuring the current flowing through a known resistance connected across the fuse being tested. However, in order for this type measurement to be accurate, two conditions must be met. First, the shunt capacitance must be small enough that the capacitive resistance is much higher than the resistance at the frequencies of interest. Second, the inductive reactance in the resistor must be much smaller than the resistance at these frequencies. Conventional resistances, however, fail to meet either of these criteria.

In accordance with the foregoing it is apparent that there currently exists the need for a high voltage probe that overcomes the limitation of prior art voltage measuring devices. The present invention satisfies that need by providing a voltage measuring device based on the concept of measuring the current flow through a known resistance. The present invention also utilizes a novel resistance element that overcomes the above noted limitations of conventional resistance elements.

SUMMARY OF THE INVENTION

The invention is a high voltage measuring device for measuring high voltage pulses produced when a metallic foil fuses while carrying a very high current. The invention is based on the concept of measuring the current flowing through a known resistance connected across the foil (and source of voltage being measured). It consists of a current transformer, a copper sulfate water resistor and an oscilloscope. The copper sulfate water resistor is connected in series with the primary winding of the current transformer and the series combination is connected across the foil and the source of voltage. The output of the current transformer secondary winding is a measure of the voltage being detected (current through the resistor and primary winding) and is connected to and displayed on the oscilloscope.

It is a principal object of the invention to provide a new and improved device for measuring fast, high voltage pulses.

It is another object of the invention to provide a device for measuring fast, high voltage pulses that operates effectively in environments of high electrical noise.

It is another object of the invention to provide a device for measuring fast, high voltage pulses that operates effectively in applications where it is required to measure the potential difference between two points when a reference potential is not well defined.

It is another object of the invention to provide a device for measuring fast, high voltage pulses that in inexpensive and simple to construct.

It is another object of the invention to provide a device for measuring fast, high voltage pulses that is rugged and easy to use.

It is another object of the invention to provide a device for measuring fast, high voltage pulses that is reliable and requires minimum maintenance.

These together with other objects, features and advantages of the invention will become more readily apparent from the following detailed description when taken in conjunction with the illustrative embodiment in the accompanying drawings.

DETAILED DESCRIPTION OF THE PREFERRED EMBODIMENT

The device of the invention is a high voltage probe that is capable of measuring pulsed voltages of hundreds of kilovolts with rise times of 20 ns or less. It consists of an aqueous solution of $CuSO_4$ filling a small diameter flexible plastic tube with a brass or copper plug in each end and a commercially available current viewing transformer. The solution in the tube forms a resistor, and the transformer is used to measure the current flowing through the resistor when a voltage is applied to the resistor.

Figure 2:
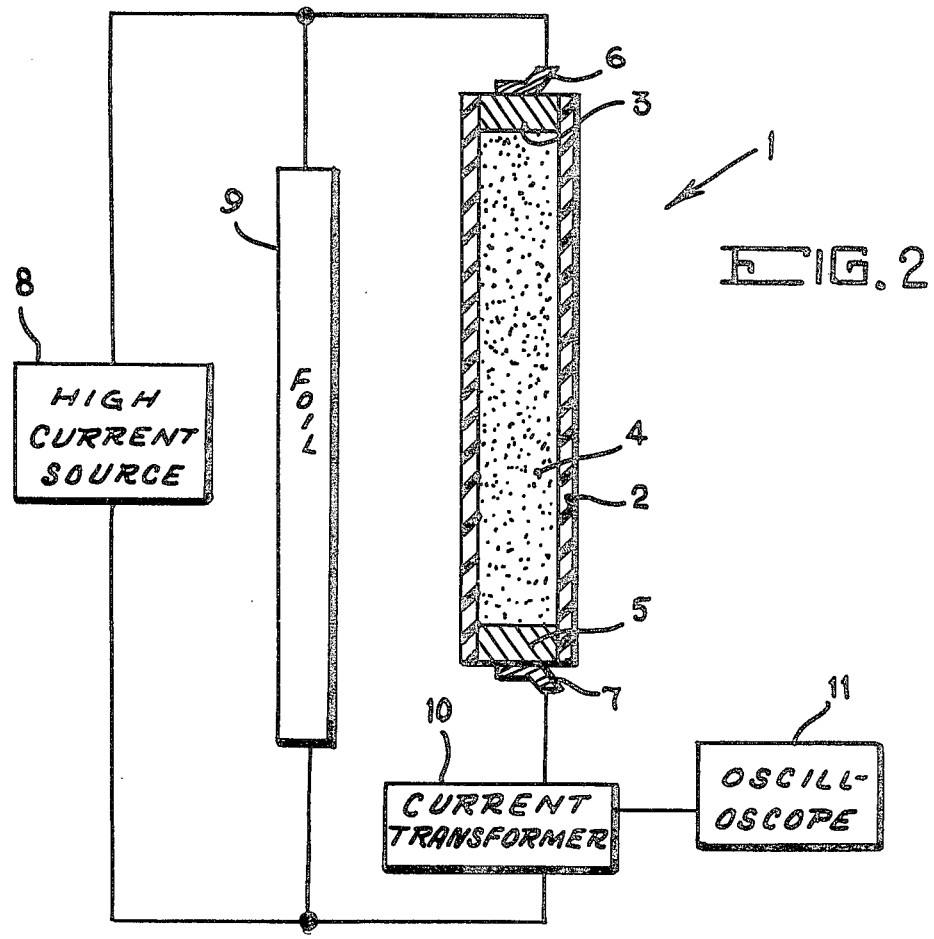
FIG. 2 is a block diagram of the circuit of FIG. 1 showing the resistance element thereof in sectional detail.
Figure 1:
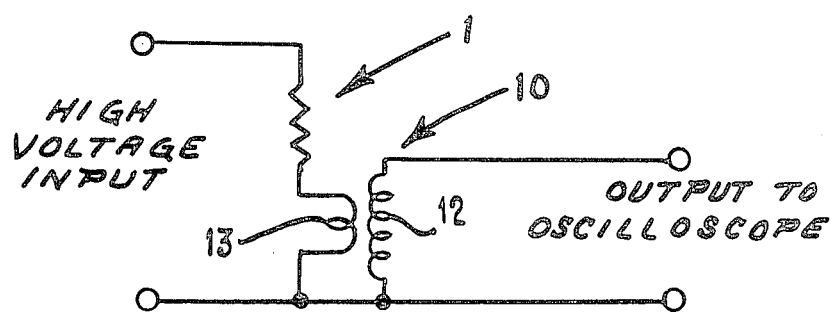
FIG. 1 is a schematic diagram of the invention.

FIG. 1 is a schematic diagram of the high voltage probe of the invention and FIG. 2 is a block diagram showing a typical application thereof. FIG. 2 also shows a sectional detail of the resistor element of the probe. Referring to FIG. 1 it is seen that resistor element 1 is connected in series with primary winding 13 of current transformer 10 and that this series arrangement is connected across the high voltage input to be measured. The secondary winding 12 of this current transformer provides a measure of the detected voltage and is outputted to an oscilloscope (not shown). FIG. 2 illustrates a specific application of the probe in which the voltage that is required to fuse a metal foil 9 is detected by the current transformer 10, resistor element 1 combination and displayed on oscilloscope 11. The metal foil 9 is fuzed by current from high current source 8 which also provides the high voltage measured by the probe. FIG. 2 also shows details of resistor element 1 which comprises plastic tube 2, metallic end plugs 3, 4 and electrical connectors 6, 7. End plugs 3, 4 provide a sealed region within the tube 2 that is filled with nearly saturated copper sulfate water.

By way of example it has been found that a design that has been particularly successful comprises a length of 0.25" I.D. Tygon tubing approximately 52 cm long and containing a nearly saturated $CuSO_4$ solution. Brass end plugs 0.5" long and 5/16" in diameter with tapped holes for No. 6-32 screws drilled part way into one end were used to make electrical connections. A Telstronex model CT-2 current transformer was used to measure the current in the resistor. The transformer was mounted near the end of the resistor and the connection to the ground side of the input signal was made at the transformer. Devices fabricated in this manner are capable of measuring as much as 400 kV peak voltage with a rise time of about 20 ns.

Various pertinent properties of the type of probe described have also been evaluated. It has been determined that a saturated aqueous solution of $CuSO_4$ at room temperature has a resistivity of about $25\Omega\text{-cm}^3$. Therefore, a 50 cm long 0.25 in diameter column of solution has a resistance of about 4 k$\Omega$. The sensitivity of the CT-2 current transformer is 1 V/A into a 50$\Omega$ load. Consequently, such a voltage probe will have a sensitivity of about 4 kV/V.

The frequency response of the resistor is also a determinant factor. Since the dielectric constant of water at megahertz frequencies is about 80, the velocity in water of a Megahertz electromagnetic wave is about one ninth C. Frequency components that are faster than the double transit time of the resistor will be lost. Therefore, the frequency response is a function of the tube length, and the upper cutoff frequency of a 50 cm long resistor is about 30 $MH_z$.

The various objects of the invention are achieved as a result of the concept of a high voltage probe that uses a current transformer to measure the current induced in a copper sulfate water resistor by the high voltage. Since a current of tens of amps is measured, these voltage probes are insensitive to electromagnetic noise. A typical voltage probe of the type comprehended by the invention can measure a triangular voltage pulse with a peak of 400 kV and a base width of 1 $\mu$s. The response time of such a probe is about 25 ns. Moreover, the response of these probes is linear from a few hundred volts up to a least 50 kV and appears to be linear up to their high voltage limits. Therefore, they can be accurately calibrated with low voltage pulses.

Operation of the high voltage probe of the invention is effected when current flows through the resistor and current transformer in response to a voltage applied across the series combination of the current transformer primary winding and the resistor. The insertion impedance of the transformer is insigificant compared to the resistor, which determines the current. Ohm's Law is then used to calculate the voltage. Connecting the primary and secondary winding of the transformer to a common ground will serve to greatly reduce electrical noise pickup by the transformer.

Current transformer voltage probes of the type described herein can be very useful in measuring voltage pulses in the hundreds of kilovolt and microsecond regimes. They are particularly well suited for use in an environment of high electromagnetic noise. In addition, they work well where the requirement is to measure the potential difference between two points, and a reference potential is not well defined. The use of an inductive isolator allows the probe to be used where there exists a large, transient potential difference between the probe and oscilloscope locations.

The probes are quite simple to construct and inexpensive. Moreover, they are very rugged and easy to use. Reliability is excellent. For example, one probe was used on over 200 high energy fuse experiments with the replacement of small amounts of resistor solution the only maintenance that was required.

One significant advantage of probes of this type is that they can be calibrated with input voltages of a few hundred volts. This procedure can be repeated periodically in order to ensure that the voltage probe calibration is well defined at all times during a prolonged series of experiments.

While the invention has been described in its preferred embodiment it is understood that the words which have been used are words of description rather than words of limitation and that changes within the purview of the appended claims may be made without departing from the scope and spirit of the invention in its broader aspects.

What is claimed is:

1. A device for measuring fast high voltage pulses comprising
   a current transformer having a primary winding and a secondary winding,
   a copper sulfate water resistor connected in series with said primary winding,
   means for connecting the series arrangement of said resistance means and said primary winding across a source of voltage to be measured, the secondary winding output of said current transformer being a function of the voltage at said source of voltage, and
   an oscilloscope, said oscilloscope being connected to receive and display the secondary winding output of said current transformer.

2. A device for measuring fast high voltage pulses as defined in claim 1 wherein said copper sulfate water resistor consists of
   an elongated small diameter flexible plastic tube,
   a metallic plug in each end thereof effecting a sealed volume therein,
   an electrical connector means affixed to the outer surface of each metallic plug, and
   an aqueous solution of copper sulfate within said sealed volume.

* * * * *